(12) United States Patent
Gryko (10) Patent No.: US 6,423,286 B1
(45) Date of Patent: Jul. 23, 2002

(54) METHOD OF MAKING SILICON CLATHRATES

(75) Inventor: Jan Gryko, Tempe, AZ (US)

(73) Assignee: Arizona Board of Regents, Tempe, AZ (US)

( * ) Notice: Subject to any disclaimer, the term of this patent is extended or adjusted under 35 U.S.C. 154(b) by 0 days.

(21) Appl. No.: 09/577,810

(22) Filed: May 24, 2000

Related U.S. Application Data (63) Continuation of application No. PCT/US99/22258, filed on Sep. 24, 1999.
(60) Provisional application No. 60/101,600, filed on Sep. 24, 1998.

(51) Int. Cl.[7] .......................... C01B 33/06; H01L 29/24
(52) U.S. Cl. ....................... 423/344; 423/348; 423/349; 136/236.1
(58) Field of Search ............... 423/344, 348, 423/349, 350; 136/236.1

(56) References Cited

U.S. PATENT DOCUMENTS

| | | | | |
|---|---|---|---|---|
| 5,800,794 A | * | 9/1998 | Tanigaki et al. | 423/324 |
| 6,103,403 A | * | 8/2000 | Grigorian et al. | 428/641 |
| 6,188,011 B1 | * | 2/2001 | Nolas et al. | 136/236.1 |

OTHER PUBLICATIONS

Smelyansky et al, The electronic structure of metallo–silicon clathrates $Na_x Si_{136}$ (x=0, 4, 8, 16 and 24), chemical Physics Letters 264, pp. 459–465, Jan. 1997.*

Translation of Cros et al, Journal of solid state chemistry, 2, pp. 570–581, 1970 (no month).*

Kasper et al., "Clathrate Structure of Silicon $Na_8Si_{46}$ and $Na_xSi_{136}$ (x<11)," Science, American Association for the Advancement of Science, vol. 150, pp. 1713–1714 (1965) No month.*

Ramachandran et al., "Synthesis and X–Ray Characterization of Silicon Clathrates," Journal of Solid State Chemistry, vol. 145, No. 2, pp. 716–730 Jul. (1999).*

Ramachandran et al., "Silicon Clathrates: Synthesis and Characterization," Mat. Res. Soc. Symp. Proc., vol. 507, pp. 483–486 Apr. (1998).*

Yamanaka et al., "Preparation of Barium–Containing Silicon Clathrate Compound," Fullerene Science & Technology, vol. 3, No. 1, pp. 21–28 (1995). No month.*

* cited by examiner

Primary Examiner—Ngoc-Yen Nguyen
(74) Attorney, Agent, or Firm—Christie, Parker & Hale, LLP (57) ABSTRACT

A method of preparing a substantially homogenous, alkali-metal silicon clathrate composition containing the silicon clathrate $M_xSi_{136}$ ($3 \leq x \leq 24$). The silicon clathrate is prepared by rapidly heating an alkali-metal silicide under a high vacuum to a decomposition temperature of at least 365° C. The produced silicon clathrates are in a substantially homogenous $M_xSi_{136}$ phase with only small amounts of a metallic silicon clathrate phase, $M_ySi_{46}$. A method of reducing the alkali-metal content of a silicon clathrate $M_xSi_{136}$ (x>0) is also provided.

5 Claims, 6 Drawing Sheets

METHOD OF MAKING SILICON CLATHRATES

CROSS-REFERENCE TO RELATED APPLICATIONS

This application is a continuation of PCT Application No. PCT/US99/22258, which claims priority of provisional application No. 60/101,600, filed on Sep. 24, 1998.

The present invention relates to a method of making a substantially homogenous, silicon clathrate composition, and more particularly, to a method of making a substantially homogenous, alkali-metal free $Si_{136}$ clathrate composition.

BACKGROUND OF THE INVENTION

Thermoelectric materials are solid-state materials that can reversibly convert electricity to heat. Key properties for any thermoelectric material are thermoelectric power, electrical conductivity and thermal conductivity. These three parameters are often combined into a dimensionless figure of merit ZT that characterizes efficiency of conversion of thermal energy into electrical energy (or vice versa) (see, e.g. Mahan, G., Sales, B., and Sharp, J., Physics Today, p. 42, (March 1997). Most thermoelectrical materials used presently have ZT~1. However, for greater efficiency, thermoelectric materials with a ZT value approaching 2 or greater are preferred. In order to meet these requirements, thermoelectric materials must exhibit large thermoelectric powers and electrical conductivities while at the same minimizing thermal conductivities. One attempt to synthesize thermoelectric materials with larger ZT values has been the development of semiconductor clathrates (i.e., metal-doped semiconductors).

Semiconductor clathrates such as alkali-metal silicon clathrates having the formula $M_xSi_{136}$ with x~3 to 6 have been found to exhibit large thermoelectric powers. As a result, $M_xSi_{136}$ clathrates appear promising as new thermoelectric materials. Unfortunately, current methods of synthesizing these clathrates by thermal decomposition of alkali-metal silicides produce a mixture of $M_xSi_{136}$ and $M_ySi_{46}$ phases (see, e.g., Cross, C., Pouchard, M., and Hagenmuller, P., C. R. Acad. Sc. Paris, vol. 260, p. 4764 (1965); Cross, C., Pouchard, M., and Hagenmuller, P., J. Solid State Chem. Phys., vol. 2, p. 570, (1970); Roy, S. B., Sim., K. E., and Caplin, A. D., Phil. Mag. B, vol. 65, p. 1445 (1992)). As known to those skilled in the art, $M_ySi_{46}$ has metallic character. As a result, mixtures of $M_xSi_{136}$ and $M_ySi_{46}$ phases exhibit significantly lower thermoelectric powers than homogenous $M_xSi_{136}$ phases. To overcome this deficiency, extensive purification steps are required to obtain a homogenous $M_xSi_{136}$ sample which increases the cost of production. Therefore, there is a need in the art for a simple and efficient method of synthesizing homogenous $M_xSi_{136}$ clathrates, which will facilitate large scale commercial applications.

Accordingly, it is an object of the present invention is to provide a simple and effective of making homogenous $M_xSi_{136}$ clathrates. It also an object of the present invention is to provide a method of making homogenous $M_xSi_{136}$ clathrates that will allow the number of alkali-metal atoms per unit crystallographic cell "x" to be varied from a maximum value 24 to as low as 0.

BRIEF SUMMARY OF THE INVENTION

The present invention provides a simple and effective method of making a substantially homogenous silicon clathrate composition. In one embodiment, the method entails rapidly heating, under a vacuum, an alkali-metal silicide to a decomposition temperature of at least 365° C. thereby forming a silicon clathrate having the formula $M_xSi_{136}$ where M is the alkali-metal and $3 \leq x \leq 24$. Preferably, the silicide is heated to the decomposition temperature within 2 minutes, and more preferably within 1 minute. Preferably, the alkali silicide is heated for at least 30 minutes with at least 60 minutes being more preferred. Examples of alkali-metals to be used for the alkali-metal suicides are sodium, potassium, cesium, rubidium and mixtures thereof. Heating is preferably conducted under a vacuum of at least $10^{-5}$ Torr, with at least $10^{-6}$ Torr being more preferred.

Advantageously, the method provides a silicon clathrate composition where at least 90 weight percent of the silicon clathrate present in the composition is $M_xSi_{136}$, with at least 95 weight percent $M_xSi_{136}$ being more preferred and at least 98 weight percent $M_xSi_{136}$ being more preferable. Preferably, the silicon clathrate formed by the above-described method has $3 \leq x \leq 6$.

In another embodiment, the present invention provides a method of reducing the alkali-metal content of an alkali-metal silicon clathrate having the formula $M_xSi_{136}$ where M is the alkali-metal and x>0, with x>3 being more preferred. This method entails a two-step process of: (a) treating the silicon clathrate with an acid, preferably strong acid; and (b) rapidly heating, under a vacuum, the treated silicon clathrate to a decomposition temperature of at least 400° C. The two steps are repeated, as necessary, to reduce the alkali-metal content to a desired number of atoms. Acids to be used include sulfuric acid, hydrochloric acid, hydrofluoric acid, nitric acid and mixtures thereof. If desired the alkali-metal content "x" can be reduced to zero to provide an alkali-metal free silicon clathrate having the formula $Si_{136}$.

DETAILED DESCRIPTION OF THE INVENTION

The present invention provides a similar and efficient method of making alkali-metal silicon clathrates having the formula $M_xSi_{136}$ at homogeneity levels previously unattainable. The production of the substantially homogenous alkali-metal silicon clathrates is accomplished by rapidly heating, under a vacuum, an alkali-metal silicide to a decomposition temperature of at least 365° C. Upon reaching the decomposition temperature within a relatively short time frame, the alkali-metal silicide transforms to an alkali-metal silicon clathrate having the formula $M_xSi_{136}$ where M is the alkali-metal and $3 \leq x \leq 24$. In this context, "substantially homogenous" means that at least 90 weight percent (wt. %) of the alkali-metal silicon clathrate formed is composed of a $Si_{136}$ phase, with the remaining silicon clathrate phase being $Si_{46}$. In a more preferred embodiment, an alkali-metal silicon clathrate with the silicon clathrate phase being at least 95 wt. % or greater $Si_{136}$ is provided. In another embodiment, the present invention provides method of reducing the alkali-metal content of a silicon clathrate having the formula $M_xSi_{136}$ where x>0.

In accordance with the present invention, rapid heating of the alkali-metal silicide is accomplished by exposing the silicide to a heat source where the alkali-metal silicide is allowed to reach the decomposition temperature within two (2) minutes or less. More preferably, the silicide is allowed to reach the decomposition temperature within one (1) minute or less. This technique is often referred in the art as "flash decomposition" or "flash degassing."

A decomposition temperature of at least 365° C. is required for effective conversion of the alkali-metal silicide to the alkali-metal $Si_{136}$ clathrate. Lower temperatures are not preferred since the concentration of the $Si_{136}$ phase will be detrimentally affected. Temperatures higher than 365° C. can be used. However, a decomposition temperature between 365–390° C. is preferable for ease of production using readily available heat sources, such as commercial furnaces.

The alkali-metal silicide is heated at the decomposition temperature for a sufficient amount of time for transformation to occur. Generally, the silicide sample is maintained at the elevated temperature for about 10 minutes or longer. The number of the alkali-metal atoms ("x") in the $Si_{136}$ cluster or unit crystallographic cell has been found to be inversely proportional to the length of time the $M_xSi_{136}$ clathrate is maintained at the decomposition temperature. Thus, "x" can be reduced from a maximum value of 24 to a lower value of 3 by merely varying the length of time the sample is heated (i.e., maintained) at the decomposition temperature. For example, after 10–20 minutes at 375° C., the $Si_{136}$ cluster will exhibit an "x" of 24 or slightly less. After 40 minutes at 375° C., "x" is reduced to 16. After 2 hour at 375° C., x is reduced to 4.5.

Throughout the heating process the silicide sample in maintained under a vacuum. Preferably, the sample is maintained under a vacuum of at least $10^{-5}$ Torr or greater (e.g., $10^{-6}$ Torr). If the heating is conducted in a non-evacuated environment, the purity (i.e., homogeneity) of the alkali-metal silicon clathrate will be detrimentally affected.

The alkali-metal silicides to be used are prepared following standard procedures described in literature as set forth in Cross, C., Pouchard, M., and Hagenmuller, P., C. R. Acad. Sc. Paris, vol. 260, p. 4764 (1965) and Cross, C., Pouchard, M., and Hagenmuller, P., J. Solid State Chem. Phys., vol. 2, p. 570, (1970), which are herein incorporated by reference. Preferred alkali-metals are sodium, potassium, cesium, rubidium and mixtures thereof, with sodium and potassium being particularly preferred.

As previously described, the present invention also provides a method of reducing the alkali-metal content of a silicon clathrate having the formula $M_xSi_{136}$ where x>0, and more preferably where $x \geq 3$. In this embodiment, an alkali-metal silicon clathrate $M_xSi_{136}$ where x>0 is first treated with an concentrated acid solution. Preferably, the treated silicon clathrate is then washed with water and/or water-miscible organic solvents to remove traces of the acid. Thereafter, the treated silicon clathrate is rapidly heated under a vacuum to a decomposition temperature of at least 400° C. where the sample is maintained at the decomposition temperature for a sufficient amount of time. The amount of time needed is variable and can easily be determined by one skilled in the art. These steps are repeated, as necessary, to lower the alkali-metal content of the $Si_{136}$ clathrate. Unexpectedly, the method enables one skilled in the art to lower the alkali-metal content to a value below 3 and if desired to a value of 0 thereby forming an alkali-metal free $Si_{136}$ clathrate, which is designated $Si_{136}$.

Acids to be used are preferably strong acids. Examples of acids to be used include, but are not limited to, hydrochloric acid, sulfuric acid, hydrofluoric acid, nitric acid and mixtures thereof. Although the exact mechanism is not known, treating the alkali-metal silicon clathrate with an acid solution facilitates reducing the alkali-metal content of the $Si_{136}$ cluster. Preferably, the clathrate is treated by immersing the clathrate in a boiling acid solution for a sufficient amount of time. The amount of time needed is variable and can easily be determined by one skilled in the art. After acid treatment, the clathrate is preferably washed with an aqueous solution to remove traces of the acid and dried prior to repeating the heating steps.

The present invention also provides an alkali-metal free silicon clathrate having the formula $M_xSi_{136}$ where x=0, or stated otherwise $Si_{136}$. As will be apparent to those skilled in the art, $Si_{136}$ does not contain an alkali-metal dopant within the cluster (i.e., unit crystallographic cell). The absence of a metal dopant within the cluster provides the clathrate with a band gap energy significantly greater than crystalline silicon.

The following non-limiting examples illustrate advantageous use of the present invention to synthesize alkali-metal $Si_{136}$ clathrates where $0 \leq x \leq 24$.

EXAMPLES

The sodium suicides used in the preparation of clathrates were obtained using the procedures described above in Cross, et al., C.R. Acad. Sc. Paris, vol. 260, p. 4764 (1965) and Cross, et al., J. Solid State Chem. Phys., vol. 2, p. 570, (1970). Production basically involved heating a 3:1 molar mixture of the alkali-metal and silicon at 700° C. in a tantalum crucible for approximately 24 hours.

Example 1

Approximately 0.3 g of sodium silicide was placed in a tantalum boat (crucible), which then was placed in a quartz test tube. The quartz test tube was subsequently inserted into a larger quartz test tube, after which the non-sealed end of the larger test tube was connected to a vacuum source providing a vacuum of $10^{-5}$ Torr. The sodium was flash decomposed by partially inserting the test tube into a large thermal capacity furnace preheated to 375° C. The test tube was left in the furnace for approximately 20 minutes. After the sample was allowed to cool, the sample was washed several times with ethanol and distilled water to remove traces of silicides.

Figure 1:
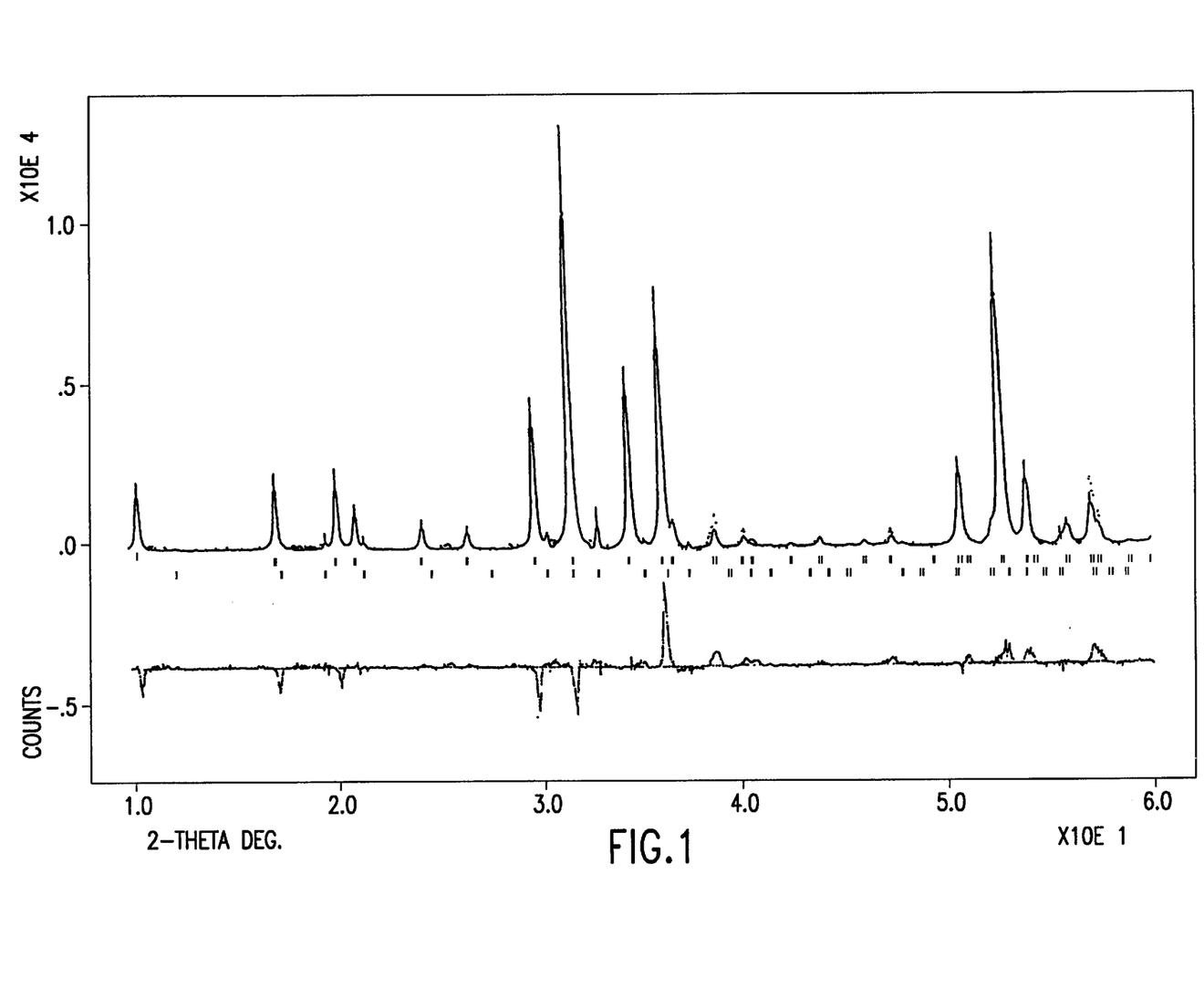
FIG. 1 is a Generalized Structure Analysis System (GSAS) plot illustrating the experimental X-ray spectrum versus the theoretical X-ray spectrum calculated for an alkali-metal silicon clathrate composition containing $M_xSi_{136}$ with x=23.5.

An X-ray spectrum was taken of the final product using a Siemens D5000 spectrometer (hereinafter an "experimental X-ray spectrum") and is shown in FIG. 1. In FIG. 1, the upper curve is a composite of the experimental X-ray pattern (dotted line) and the calculated X-ray pattern (solid line) for the alkali-metal silicon clathrate composition. The calculated X-ray spectrum was generated using the Generalized Structure Analysis System (GSAS) program publicly available from Los Alamos through their web page, which was preset to a 1:1 $M_xSi_{136}/M_8Si_{46}$ composition where x=24. Below the upper curve are two (2) rows of vertical dashes indicating the predicted peak positions for $M_xSi_{136}$ clathrate (upper row of vertical dashes) and $M_ySi_{46}$ metallic clathrate (lower row). The small peak in the calculated X-ray spectrum at 32.8° indicates presence of small amount of metallic $M_ySi_{46}$ phase. The lower curve of FIG. 1 is the difference between the experimental and calculated X-ray spectrums for the $M_xSi_{136}$ clathrate found in the product. The alkali-metal composition of clathrates was measured by fitting the experimental X-ray spectrum to calculated spectrum. X-ray analysis revealed that the final product contained at least 98 wt. % $Na_{23.5}Si_{136}$ clathrate (i.e., x=23.5) with approximately 1–2 wt. % $Na_ySi_{46}$.

Example 2

Figure 2:
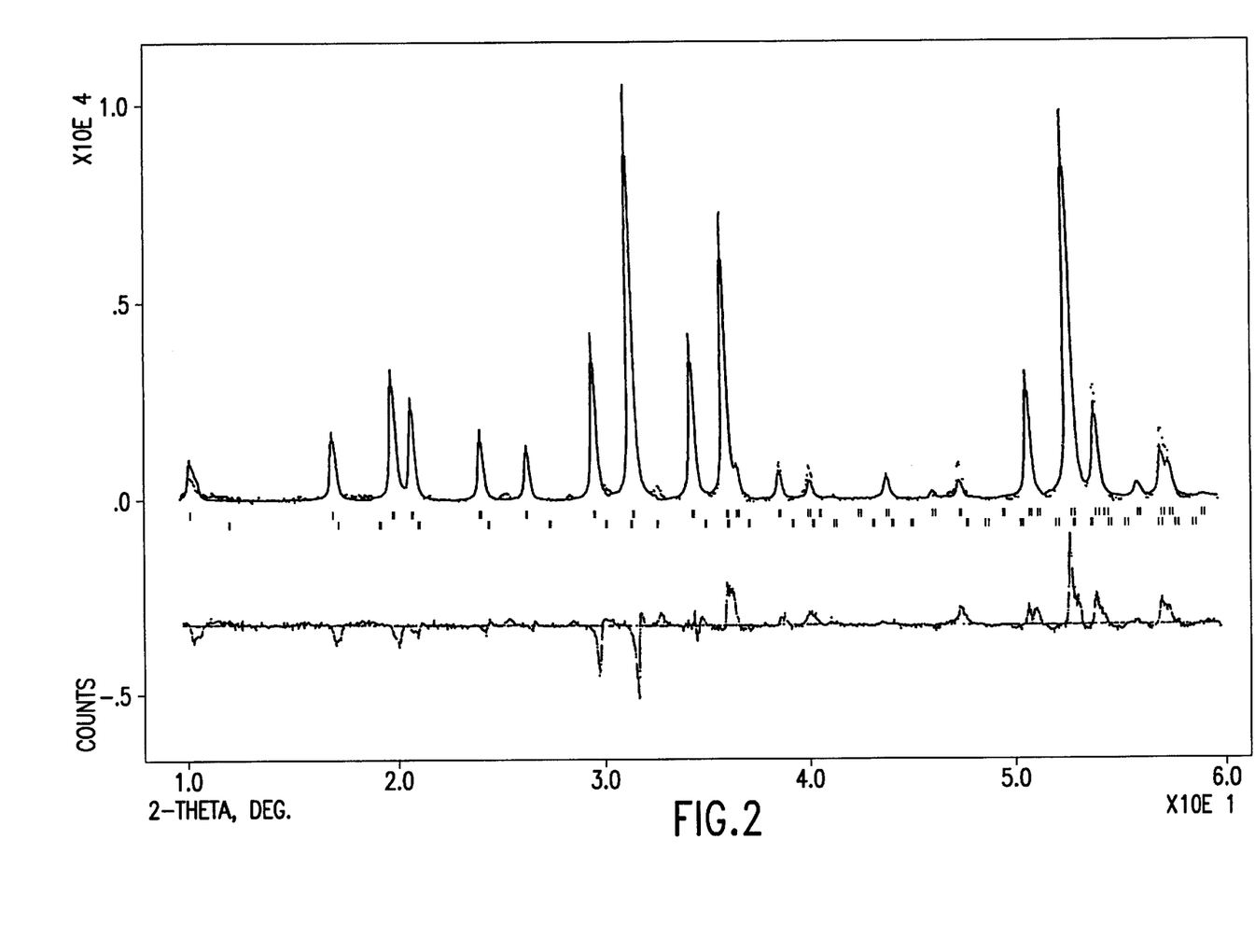
FIG. 2 is GSAS plot illustrating the experimental X-ray spectrum versus the theoretical X-ray spectrum calculated for an alkali-metal silicon clathrate composition containing $M_xSi_{136}$ with x=16.

Following the procedure of Example 1, approximately 0.3 g of sodium silicide was flash decomposed for 40 minutes. The resulting product was identified as $Na_{16}Si_{136}$ clathrate containing approximately 1–2 wt. % $Na_ySi_{46}$ as revealed by the X-ray spectrums shown in FIG. 2.

Example 3

Figure 3:
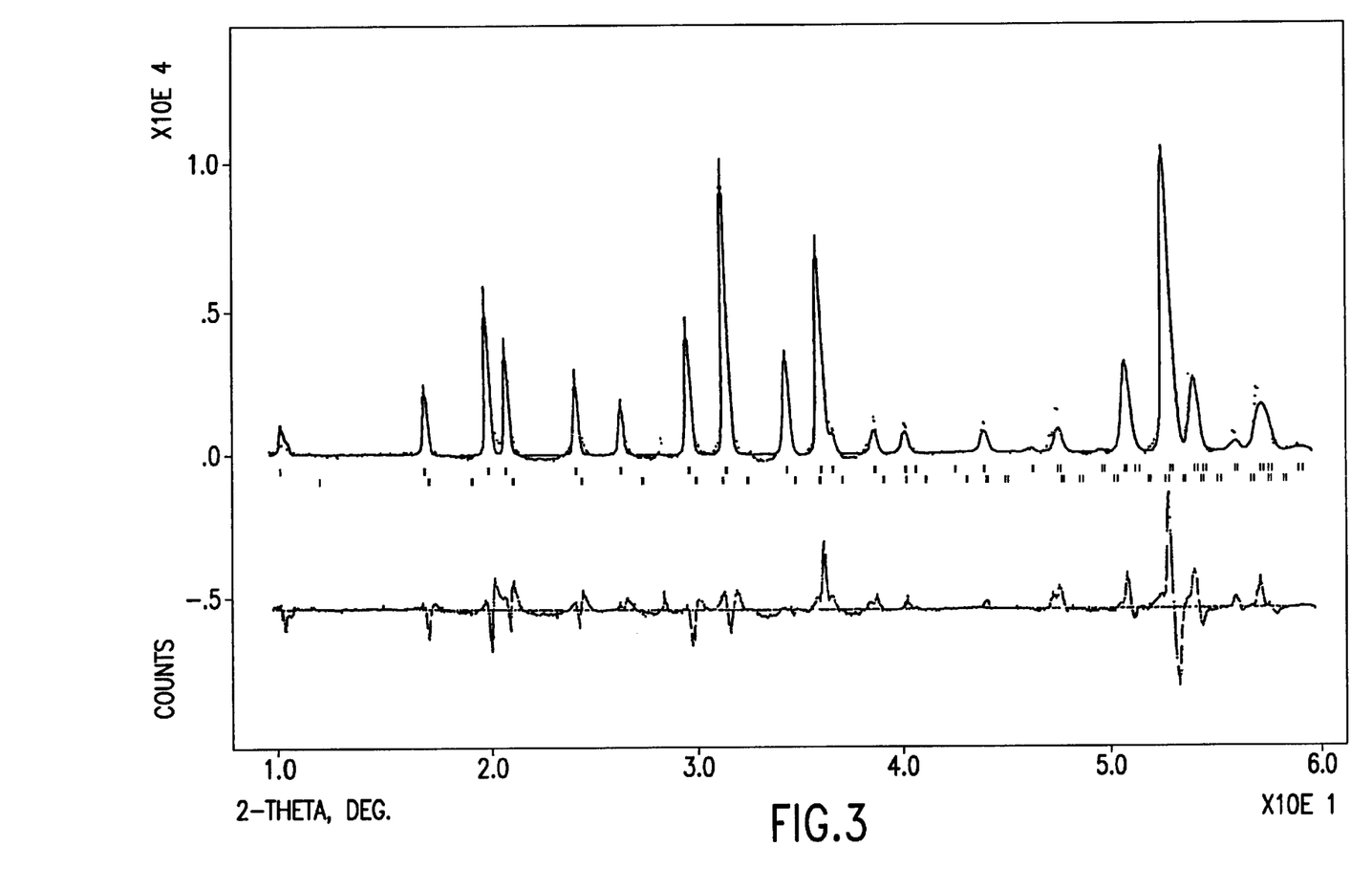
FIG. 3 is GSAS plot illustrating the experimental X-ray spectrum versus the theoretical X-ray spectrum calculated for an alkali-metal silicon clathrate composition containing $M_xSi_{136}$ with x=10.

Following the procedure of Example 1, approximately 0.3 g of sodium suicide was flash decomposed for approximately one (1) hour. The resulting product was identified as $Na_{10}Si_{136}$ clathrate containing approximately 1–2 wt. % $Na_ySi_{46}$ as revealed by the X-ray spectrums shown in FIG. 3.

Example 4

Figure 4:
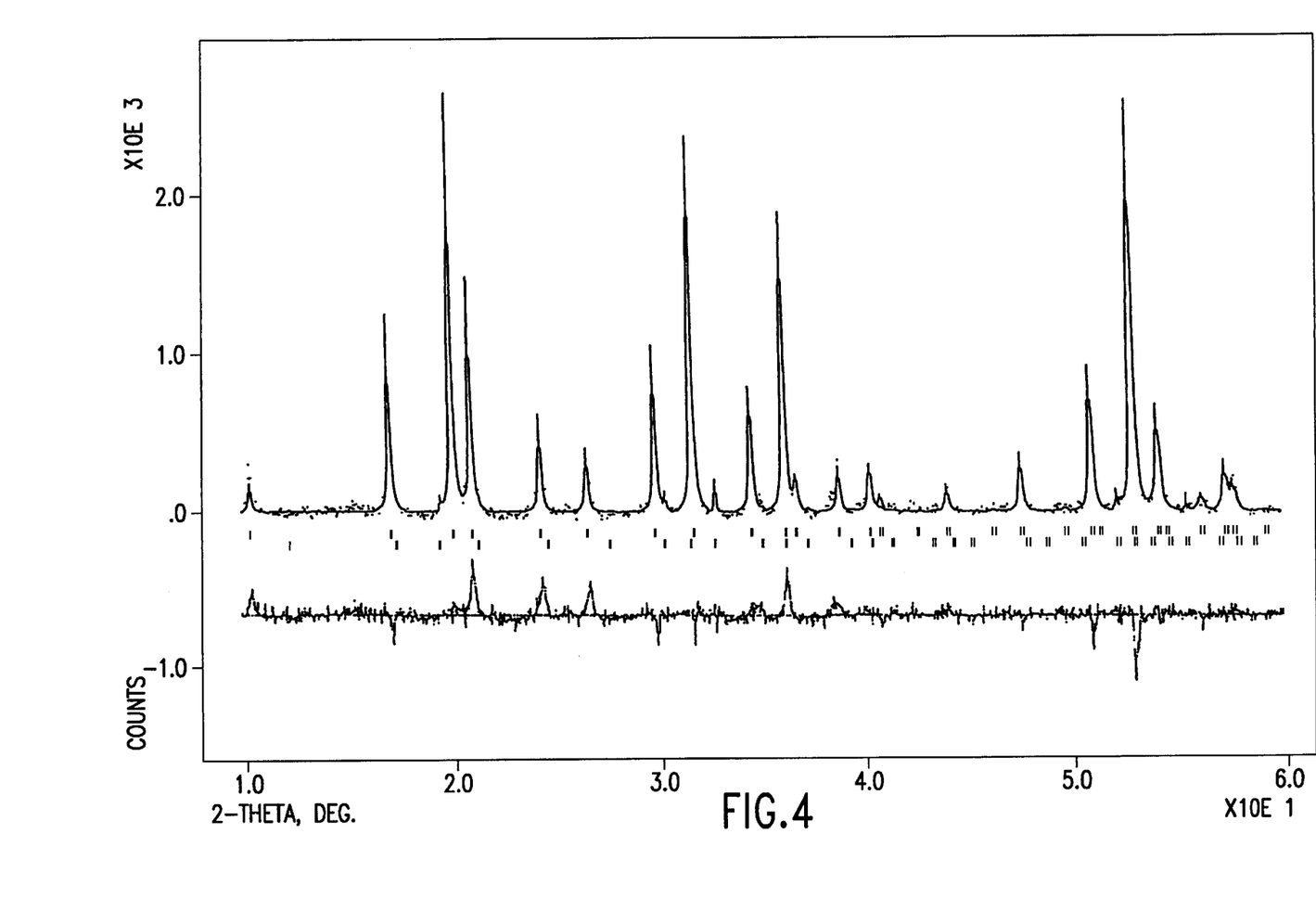
FIG. 4 is a GSAS plot illustrating the experimental X-ray spectrum versus the theoretical X-ray spectrum calculated for an alkali-metal silicon clathrate composition containing $M_xSi_{136}$ with x=4.5.

Following the procedure of Example 1, approximately 0.3 g of sodium silicide was flash decomposed for approximately two (2) hours. The resulting product was identified as $Na_{4.5}Si_{136}$ clathrate containing approximately 1–2 wt. % $Na_ySi_{46}$ as revealed by the X-ray spectrums shown in FIG. 4.

Example 5

Figure 5:
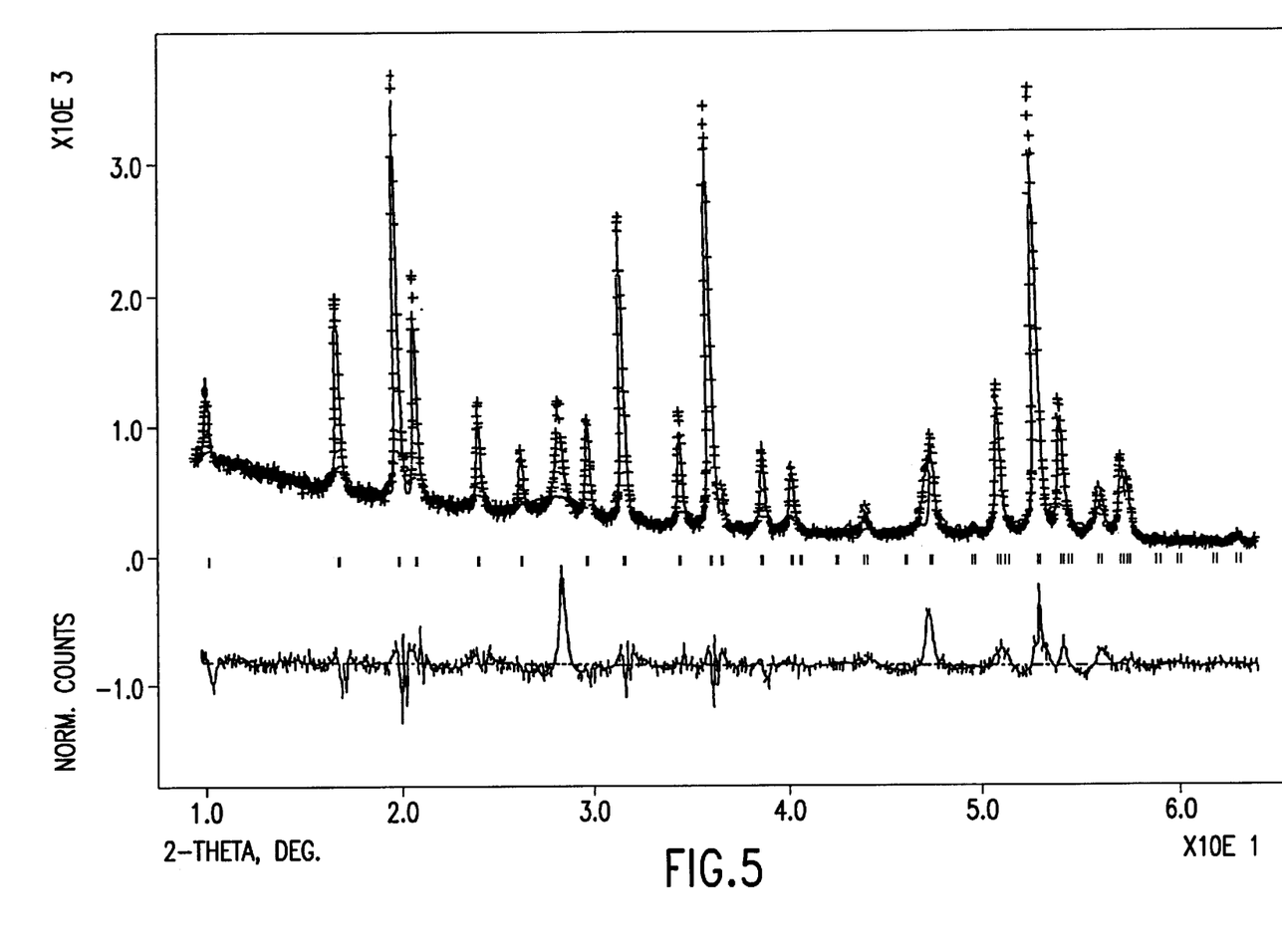
FIG. 5 is a GSAS plot illustrating the experimental X-ray spectrum versus the theoretical X-ray spectrum calculated for an alkali-metal free silicon clathrate having the formula $M_xSi_{136}$ with x=0 (i.e., $Si_{136}$).
Figure 6:
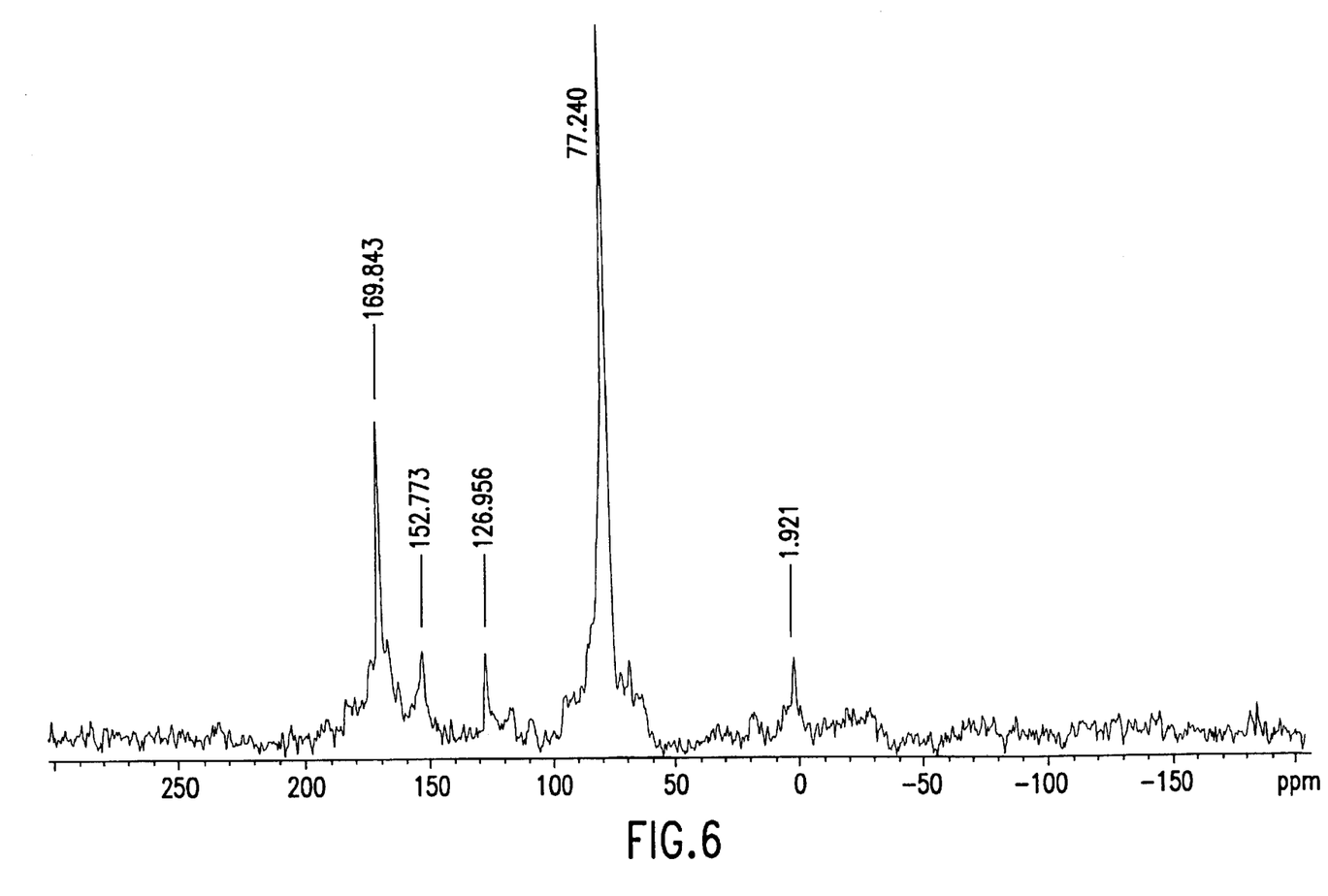
FIG. 6 is a $^{29}Si$ NMR spectrum for the alkali-metal free silicon clathrate having the formula $Si_{136}$.

Following the procedure of Example 1, a $Na_{(3-4)}Si_{136}$ clathrate composition free of $Na_ySi_{46}$ was prepared. Approximately 0.7 grams of $Na_{(3-4)}Si_{136}$ was immersed in a boiling 12 M hydrochloric (HCl) acid solution for 15 minutes. The samples was then washed with deionized (DI) water until traces of HCl were removed. The sample was then dried. The dried sample was flashed decomposed using the apparatus described in Example 1at a temperature of 430° C. for approximately 36 hours. Once the sample cooled, the sample was then washed with ethanol followed by DI water to remove traces of silicide. The sample was again immersed in a boiling HCl solution and washed with DI water. The procedure of flash decomposing the sample followed by ethanol/DI water washes and treatment with HCl was repeated three (3) times. After the final round of flash decomposition, the sample was washed with ethanol followed by DI water. After the sample was dried, the sample was density fractionated using a 8.9:1 mixture of dibromomethane/absolute alcohol (density–2.03 g/mL). Approximately 150 mg of material with a density less than 2.03 g/cm$^3$ was collected. The collected material was analyzed using X-ray spectroscopy as in Example 1 (FIG. 5) and $^{29}$Na NMR with a Varian 400 MHz spectrometer (FIG. 6). The $^{29}$Si NMR was used since it provides greater sensitivity for determining extremely low sodium levels in $Na_xSi_{136}$ clathrate because the width of $^{29}$Si NMR lines strongly depends on sodium content. The $^{29}$Si NMR line is very broad for x=3 and it is splitting into three distinct, sharp lines for x=0 as shown in FIG. 6. The collected material was determined to be $Si_{136}$ clathrate with a sodium content of zero (i.e., x=0). Purity of $Si_{136}$ sample estimated from X-ray and NMR spectra was at least 95 wt. %.

The band gap potential of the sodium-free $Si_{136}$ clathrate was determined by measuring electrical conductivity at a temperature range from 250–330° C. The band gap energy was determined to be about 1.8 eV. As known to those skilled in the art, the band gap energy for crystalline silicon is only 1.13 eV. Accordingly, alkali-metal free $Si_{136}$ clathrates provide a wider band gap currently available from crystalline silicon.

What is claimed:

1. A method of reducing the alkali-metal content of a silicon clathrate having the formula $M_xSi_{136}$ where M is said alkali-metal and x>0, which comprises:
    (a) treating said silicon clathrate with an acid;
    (b) rapidly heating, under a vacuum, said treated silicon clathrate to a decomposition temperature of at least 400° C.; and
    (c) repeating steps (a) and (b), as necessary, to reduce said alkali-metal content.
2. The method of claim 1, wherein said acid is a strong acid.
3. The method of claim 1, wherein said acid is selected from the group consisting of sulfuric acid, hydrochloric acid, hydrofluoric acid, nitric acid and mixtures thereof.
4. The method of claim 1, wherein x is reduced to zero.
5. The method of claim 1, wherein x$\geq$3.

* * * * *

UNITED STATES PATENT AND TRADEMARK OFFICE
CERTIFICATE OF CORRECTION

PATENT NO. : 6,423,286 B1
DATED : July 23, 2002
INVENTOR(S) : Jan Gryko

It is certified that error appears in the above-identified patent and that said Letters Patent is hereby corrected as shown below:

<u>Title Page,</u>
Item [57], ABSTRACT,
Line 3, change "($3 \leqq x \leqq 24$)" to -- ($3 \leq x \leq 24$) --

<u>Column 1,</u>
Line 10, before "The present invention...", insert the following headings and paragraph:
--        STATEMENT REGARDING FEDERALLY SPONSORED
              RESEARCH OR DEVELOPMENT
       The U.S. Government has certain rights in this invention pursuant to Grant No. DMR-9632635, awarded by the National Science Foundation.
              FIELD OF THE INVENTION --
Line 29, change "same minimizing" to -- same time minimizing --
Line 56, delete "is" (second occurrence)
Line 57, change "effective of" to -- effective method of --
Line 59, delete "is"

<u>Column 2,</u>
Line 5, change "$3 \leqq x \leqq 24$" to -- $3 \leq x \leq 24$ --
Line 20, change "$3 \leqq x \leqq 6$" to -- $3 \leq x \leq 6$ --
Lines 43 and 47, change "is GSAS" to -- is a GSAS --

<u>Column 3,</u>
Line 8, change "$3 \leqq x \leqq 24$" to -- $3 \leq x \leq 24$ --
Line 15, change "provides method" to -- provides a method --
Line 24, change "referred in" to -- referred to in --
Line 50, change "in" to -- is --

<u>Column 4,</u>
Line 2, change "$x \geqq 3$" to -- $x \geq 3$ --
Line 4, change "an" to -- a --
Line 42, change "$0 \leqq x \leqq 24$" to -- $0 \leq x \leq 24$ --
Line 45, change "suicides" to -- silicides --

<u>Column 5,</u>
Line 13, change "indicates presence" to -- indicates the presence --
Line 13, change "of small" to -- of a small --
Line 53, change "samples" to -- sample --

UNITED STATES PATENT AND TRADEMARK OFFICE
CERTIFICATE OF CORRECTION

PATENT NO. : 6,423,286 B1
DATED : July 23, 2002
INVENTOR(S) : Jan Gryko

It is certified that error appears in the above-identified patent and that said Letters Patent is hereby corrected as shown below:

Column 6,
Line 22, change "splitting" to -- split --
Line 37, change "formula" to -- composition --
Line 52, change "x≧3" to -- x≥3 --

Signed and Sealed this

Seventh Day of October, 2003

JAMES E. ROGAN
*Director of the United States Patent and Trademark Office*